United States Patent
Lee et al.

(10) Patent No.: US 8,343,454 B2
(45) Date of Patent: *Jan. 1, 2013

(54) SPHERICAL ASSEMBLY PARTICLE COMPOSITION OF CUPROUS OXIDE AND PREPARATION METHOD THEREOF

(75) Inventors: Woo-Ram Lee, Daejeon (KR); Sang-Ho Kim, Daejeon (KR); Sung-Ho Yoon, Daejeon (KR)

(73) Assignee: LG Chem, Ltd., Seoul (KR)

( * ) Notice: Subject to any disclaimer, the term of this patent is extended or adjusted under 35 U.S.C. 154(b) by 260 days.

This patent is subject to a terminal disclaimer.

(21) Appl. No.: 12/452,794

(22) PCT Filed: Jun. 25, 2008

(86) PCT No.: PCT/KR2008/003643
§ 371 (c)(1),
(2), (4) Date: Jan. 22, 2010

(87) PCT Pub. No.: WO2009/014320
PCT Pub. Date: Jan. 29, 2009

(65) Prior Publication Data
US 2010/0119828 A1    May 13, 2010

(30) Foreign Application Priority Data

Jul. 25, 2007  (KR) .................. 10-2007-0074812
Dec. 12, 2007  (KR) .................. 10-2007-0129351

(51) Int. Cl.
*C01G 3/00*  (2006.01)
(52) U.S. Cl. ........................................ 423/604; 423/42

(58) Field of Classification Search .................. 423/604, 423/42
See application file for complete search history.

(56) References Cited

U.S. PATENT DOCUMENTS

| 5,409,686 | A | 4/1995 | Mrusek et al. |
| 5,861,136 | A | 1/1999 | Glicksman et al. |
| 2006/0098065 | A1 | 5/2006 | Maruyama et al. |
| 2010/0116089 | A1 * | 5/2010 | Lee et al. ........................ 75/362 |

FOREIGN PATENT DOCUMENTS

| JP | 2006-096655 | 4/2006 |
| KR | 10-2005-0084099 | 8/2005 |

* cited by examiner

*Primary Examiner* — Steven Bos
(74) *Attorney, Agent, or Firm* — McKenna Long & Aldridge LLP

(57) ABSTRACT

A $Cu_2O$ spherical assembly particle composition is composed of $Cu_2O$ spherical assembly particles, each of which is formed by agglomerating a plurality of $Cu_2O$ ultrafine particles that have an average diameter in the range from 1 to 100 nm and a standard deviation on the diameter in the range from 0 to 10%. The $Cu_2O$ spherical assembly particles have an average diameter in the range from 0.1 to 10 μm and a standard deviation on the diameter in the range from 0 to 40%. This $Cu_2O$ spherical assembly particle composition is composed of $Cu_2O$ assembly particles with excellent uniformity, so it shows excellent properties such as realizing a good electric conductivity during a curing process for wiring. Accordingly, the spherical $Cu_2O$ assembly particle composition may be usefully used as precursors for solar energy conversion, magnetic storage medium, catalyst, gas sensor, and copper wire formation.

11 Claims, 5 Drawing Sheets

SPHERICAL ASSEMBLY PARTICLE COMPOSITION OF CUPROUS OXIDE AND PREPARATION METHOD THEREOF

This application claims the benefit of PCT/KR2008/003643 filed on Jun. 25, 2008, Korean Patent Application No. 10-2007-0074812 filed on Jul. 25, 2007 and Korean Patent Application No. 10-2007-0129351 filed on Dec. 12, 2007, all of which are hereby incorporated herein by reference for all purposes in their entirety.

TECHNICAL FIELD

The present invention relates to a $Cu_2O$ assembly particle composition formed by agglomerating a plurality of $Cu_2O$ ultrafine particles, and its preparation method. More particularly, the present invention relates to a $Cu_2O$ assembly particle composition whose shape and size are controlled, and its preparation method.

BACKGROUND ART $Cu_2O$ is used as precursors for solar energy conversion, magnetic storage medium, catalyst, gas sensor, and copper wire formation, and there are active studies related to composition of particles in a nano or micro size level.

As well known in the art, properties of particles are greatly changed according to their size. For example, ultrafine particles in a nano size level have a lower welding point than bulk particles, and activation of the ultrafine particles is maximized due to the increase of a surface area. However, the ultrafine particles have bad workability, so they are not easily handled. Thus, there is a demand for $Cu_2O$ particles that may ensure excellent workability while exhibiting their inherent properties sufficiently.

[Nano Lett. 2003, 3, 231.] discloses a preparation method of $Cu_2O$ particles with a size of 200 to 450 nm. The $Cu_2O$ particles are formed as a mixture of simple $Cu_2O$ particles with a low density, which have a hollow tube shape, so they may not easily satisfy the inherent properties and workability of ultrafine particles.

In addition, Korean Laid-open Patent Publication No. 10-2005-84099 discloses a method for preparing $Cu_2O$ particles by reducing $Cu_2O$ precursors using a hydrazine-based reducing agent. However, if such a strong reducing agent is used to prepare $Cu_2O$ particles, the size of generated $Cu_2O$ particles is rapidly increased due to rapid reduction reaction, so the $Cu_2O$ assembly particles have irregular shapes, and the particle sizes also become more irregular.

Meanwhile, Japanese Laid-open Patent Publication No. 2006-96655 discloses a method for preparing $Cu_2O$ particles by reducing copper sulfate using a weak reducing agent. The $Cu_2O$ particles prepared using copper sulfate as a precursor are made as a mixture of simple $Cu_2O$ ultrafine particles.

DISCLOSURE

Technical Problem

The present invention is designed to solve the problems of the prior art, and therefore it is an object of the present invention to provide a $Cu_2O$ assembly particle composition, which may sufficiently exhibit inherent properties of ultrafine particles and also ensure uniformity of $Cu_2O$ assembly particles.

Another object of the present invention is to provide a preparation method of the $Cu_2O$ particles.

Technical Solution

The technical solution to solve the above problem is as follows.

First, the present invention provides a $Cu_2O$ spherical assembly particle composition, which is composed of $Cu_2O$ spherical assembly particles, each of which is formed by agglomerating a plurality of $Cu_2O$ ultrafine particles that have an average diameter in the range from 1 to 100 nm and a standard deviation on the diameter in the range from 0 to 10%, wherein the $Cu_2O$ spherical assembly particles have an average diameter in the range from 0.1 to 10 μm and a standard deviation on the diameter in the range from 0 to 40%.

In the $Cu_2O$ spherical assembly particle composition according to the present invention, the $Cu_2O$ spherical assembly particles may be coated with a surfactant. Particularly, the surfactant may be polyacrylamide.

In addition, the present invention also provides a preparation method for a $Cu_2O$ spherical assembly particle composition, comprising: (Step 1) preparing a $Cu_2O$ precursor solution by dissolving a carboxyl copper compound expressed by the following Chemical Figure 1, or a copper salt and a carboxyl group-contained compound expressed by the following Chemical Figure 2 into a solvent;

Chemical Figure 1

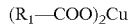

where $R_1$ is an alkyl group having a carbon number in the range from 1 to 18,

Chemical Figure 2

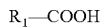

where $R_1$ is an alkyl group having a carbon number in the range from 1 to 18, (Step 2) putting a weak reducing agent having a standard reduction potential in the range from −0.2 to −0.05V into the $Cu_2O$ precursor solution to form $Cu_2O$ spherical assembly particles, each of which is formed by agglomerating a plurality of $Cu_2O$ ultrafine particles that have an average diameter in the range from 1 to 100 nm and a standard deviation on the diameter in the range from 0 to 10%, the $Cu_2O$ spherical assembly particles having an average diameter in the range from 0.1 to 10 μm and a standard deviation on the diameter in the range from 0 to 40%; and (Step 3) separating the $Cu_2O$ spherical assembly particles from the resultant material of the Step 2.

In the preparation method for a $Cu_2O$ spherical assembly particle composition according to the present invention, the weak reducing agent may use ascorbic acid, diol compound, citric acid, fructose, amine compound, α-hydroxy ketone compound, succinic acid, maltose and so on.

In the preparation method for a $Cu_2O$ spherical assembly particle composition according to the present invention, the $Cu_2O$ precursor solution may be further added with a surfactant, most preferably polyacrylamide.

BEST MODE

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation.

Figure 1:
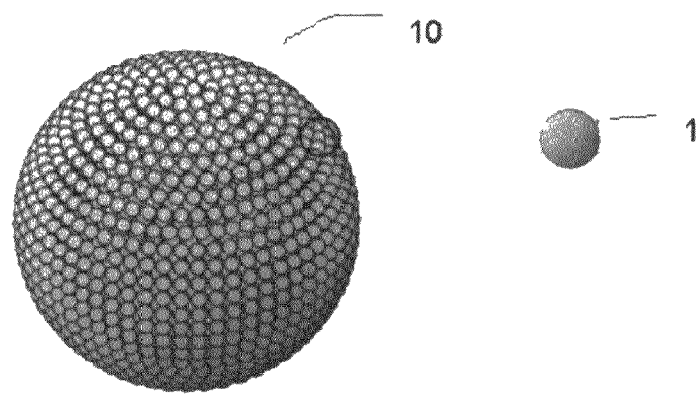
FIG. 1 is a schematic diagram showing a $Cu_2O$ assembly particle according to the present invention.

FIG. 1 is a schematic diagram showing a Cu₂O assembly particle according to the present invention. Referring to FIG. 1, the Cu₂O spherical assembly particle 10 for composing a composition of the present invention is formed in a way that a plurality of a Cu₂O ultrafine particles 1 are agglomerated.

The Cu₂O ultrafine particles 1 have an average diameter in the range from 1 to 100 nm. If the average diameter of the Cu₂O ultrafine particles is less than 1 nm, it is difficult to form a Cu₂O assembly particle. If the average diameter exceeds 100 nm, it is difficult to exhibit inherent properties of ultrafine particles. The average diameter of the ultrafine particles is preferably in the range from 1 to 10 nm. In addition, a standard deviation on the diameter of the Cu₂O ultrafine particles 1 is in the range from 0 to 10%. If the standard deviation exceeds 10%, it is difficult to form Cu₂O assembly particles of uniform size and shape.

Meanwhile, the Cu₂O assembly particle 10 has a spherical shape with an average diameter in the range from 0.1 to 10 μm. If the average diameter of Cu₂O assembly particles is less than 0.1 μm, it is meaningless to form an assembly particle. If the average diameter exceeds 10 μm, the workability is deteriorated due to the large size. The average diameter of Cu₂O assembly particles 10 is preferably in the range from 0.3 to 2 μm. In addition, a standard deviation on the diameter of Cu₂O assembly particles 10 is in the range from 0 to 40%, preferably in the range from 0 to 20%. If the standard deviation exceeds 40%, properties on patterning are deteriorated during a wiring process due to irregular sizes.

In this specification, the spherical shape includes not only a perfect sphere whose aspect ratio is 1 at each section, but also an oval sphere whose aspect ratio is not greater than 2 at each section.

As mentioned above, the Cu₂O assembly particles of the present invention have a spherical shape with high uniformity, in which ultrafine particles controlled to a predetermined size are agglomerated, so they may exhibit inherent properties of ultrafine particles sufficiently. For example, the Cu₂O spherical assembly particle composition of the present invention, controlled to the same size and shape identically, ensures a low fusion temperature and a greatly increased surface area. In addition, the composition has a diameter capable of ensuring suitable workability. Accordingly, the composition may be usefully applied as a precursor for solar energy conversion, magnetic storage medium, catalyst, gas sensor, and copper wire formation.

The Cu₂O spherical assembly particle composition of the present invention may be prepared using the following method.

Figure 2:
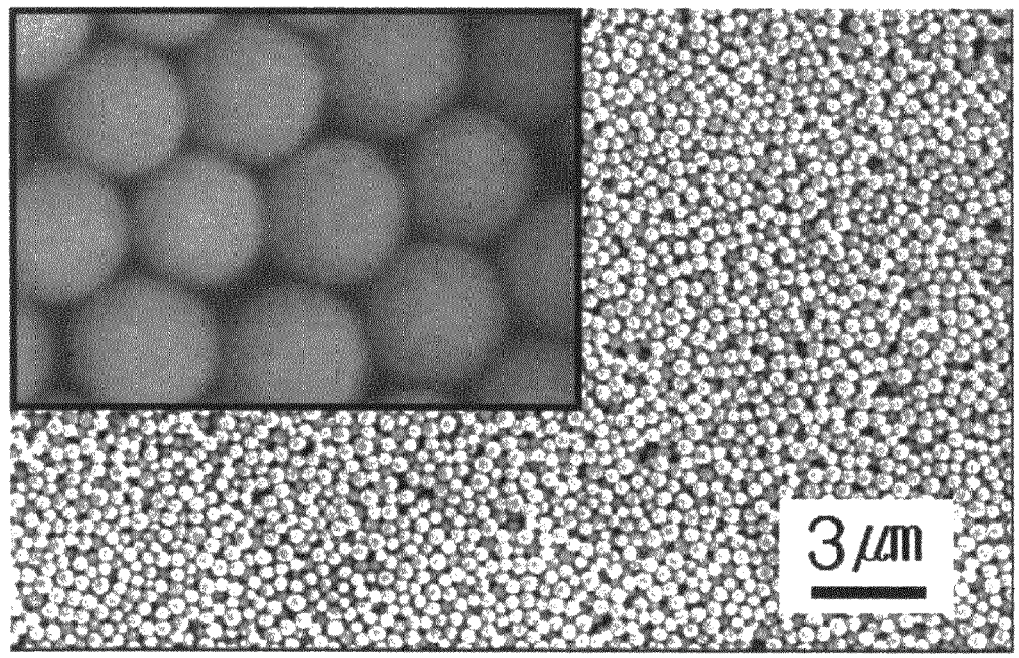
FIG. 2 is a SEM (Scanning Electron Microscope) photograph showing $Cu_2O$ particles prepared according to a first embodiment.

First, a Cu₂O precursor solution is prepared in a way of dissolving a carboxyl copper compound expressed by the following Chemical Figure 1, or a copper salt and a carboxyl group-contained compound expressed by the following Chemical Figure 2 into a solvent (Step 1).

Chemical Figure 1

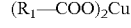

where $R_1$ is an alkyl group having a carbon number in the range from 1 to 18.

Chemical Figure 2

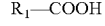

where $R_1$ is an alkyl group having a carbon number in the range from 1 to 18.

The carboxyl copper compound of the chemical figure 1 may be $(CH_3COO)_2Cu$, and the carboxyl group-contained compound of the chemical figure 2 may be $CH_3COOH$. In addition, the copper salt may be any one material or a mixture of at least two materials selected from the group consisting of copper nitrate, copper halide, copper hydroxide and copper sulfate.

Also, the solvent is used for dissolving the carboxyl copper compound or the carboxyl group-contained compound and the copper salt, mentioned above. This solvent may employ any solvent capable of forming a Cu₂O assembly particle of the present invention when a weak reducing agent is added thereto, and for example the solvent may be any one material or a mixture of at least two materials selected from the group consisting of water, $C_1$-$C_6$ low alcohol, dimethyl formamide, dimethyl sulfoxide, tetrahydrofuran and acetonitrile. Preferably, the solvent contains water.

Subsequently, a weak reducing agent having a standard reduction potential in the range from −0.2 to −0.05V was put into the prepared Cu₂O precursor solution to form Cu₂O spherical assembly particles, each of which is formed by agglomerating a plurality of Cu₂O ultrafine particles that have an average diameter in the range from 1 to 100 nm and a standard deviation on the diameter in the range from 0 to 10%, the Cu₂O spherical assembly particles having an average diameter in the range from 0.1 to 10 μm and a standard deviation on the diameter in the range from 0 to 40% (Step 2). The sizes of the assembly particles and Cu₂O ultrafine particles may be controlled by changing reaction conditions such as kind of solvent, addition of surfactant, and so on.

The weak reducing agent may be put in advance before the Cu₂O precursor is dissolved in the solvent in the step 1, or a weak reducing agent may be dissolved in a separate solvent and then put into the $Cu_2O$ precursor solution. The weak reducing agent is preferably a weak reducing agent having a standard reducing potential in the range from −0.2 to −0.05V. If the standard reducing potential is less than −0.2V, a reducing speed becomes too fast, so $Cu_2O$ ultrafine particles with irregular sizes are obtained, which does not allow giving a spherical assembly particle. If the standard reducing potential exceeds −0.05V, $Cu_2O$ ultrafine particles are not well formed or too slowly formed, resulting in bad economy. The weak reducing agent may be any one material or a mixture of at least two materials selected from the group consisting of ascorbic acid, diol compound, citric acid, fructose, amine compound, α-hydroxy ketone compound, succinic acid, and maltose.

The process of forming a $Cu_2O$ spherical body, which is an assembly particle, through the steps 1 and 2 may be explained as follows.

In the $Cu_2O$ precursor solution, the carboxyl copper compound expressed by the following Chemical Figure 1, or the copper salt and the carboxyl group-contained compound expressed by the following Chemical Figure 2 form copper ions and $R_1$—$COO^-$ ions. According to the addition of the weak reducing agent, the copper ions are reduced at a predetermined speed to grow into $Cu_2O$ ultrafine particles, and $R_1$—$COO^-$ ions are dative-bonded to surfaces of the formed $Cu_2O$ ultrafine particles. At this time, $COO^-$ is positioned on the surface of the $Cu_2O$ ultrafine particle, and $R_1$ that is a hydrophobic portion is oriented outward. Accordingly, an outer portion of the $Cu_2O$ ultrafine particles have a hydrophobic property, and thus the $Cu_2O$ ultrafine particles are agglomerated with each other in a hydrophile circumstance, thereby forming a $Cu_2O$ assembly particle.

That is to say, spherical $Cu_2O$ assembly particles are formed in a way that copper ions in a $Cu_2O$ precursor solution are reduced at a suitable speed using the weak reducing agent with a predetermined standard reduction potential, and then the formed $Cu_2O$ ultrafine particles are agglomerated by means of $R_1$—$COO^-$ ions.

Differently from the above, in case a $Cu_2O$ precursor is reduced using a hydrazine-based reducing agent that is a strong reducing agent as disclosed in the Korean Laid-open Patent Publication No. 10-2005-84099, a reduction reaction occurs rapidly, so the formed $Cu_2O$ particles have a great size. Thus, there occur simple $Cu_2O$ particles, not an assembly particle, and it causes sediment before agglomeration and also makes the $Cu_2O$ assembly particles be formed with irregular shapes and sizes.

In addition, in case $Cu_2O$ particles are made in a way of reducing a $Cu_2O$ precursor using copper sulfate as a weak reducing agent as disclosed in the Japanese Laid-open Patent Publication No. 2006-96655, a mixture of simple $Cu_2O$ particles is obtained since there is no $R_1$—$COO^-$ ion that allows agglomeration of formed $Cu_2O$ ultrafine particles.

In order to enhance the uniformity of sizes of $Cu_2O$ assembly particles, it is possible to further add a surfactant to the $Cu_2O$ precursor solution. The size of the assembly particle may be controlled depending on the kind and dosage of the surfactant, and the added surfactant is present in a state of being formed on the surfaces of the $Cu_2O$ assembly particles.

The surfactant is an amphipathic material having both a hydrophile group and a hydrophobic group in one molecule, and it may adopt a common surfactant used in preparation of $Cu_2O$ particles. For example, the surfactant may be a low molecule surfactant having at least one functional group selected from the group consisting of —OH, —COOH, —SH and —NH, or a polymer surfactant such as polyacrylamide, polyvinylpyrrolidone, and polyvinylalcohol, which may be used in single or in mixture of at least two of them. In particular, in case the surfactant is polyacrylamide, the shapes and sizes of obtained $Cu_2O$ assembly particles become more uniform, so it is possible to obtain a spherical $Cu_2O$ assembly particle composition whose standard deviation on the diameter of the $Cu_2O$ spherical assembly particles is 0 to 20%.

In the spherical $Cu_2O$ assembly particle composition according to the present invention, the $Cu_2O$ precursor and the weak reducing agent in the solution preferably have concentrations in the range from 1 mM to 500 mM, respectively. In addition, the surfactant preferably has a concentration in the range from 10 mM to 1 M.

The spherical $Cu_2O$ assembly particle composition according to the present invention may be made with mild reaction conditions at a temperature in the range from 5 to 40° C., and this process may be completed within a relatively short time at a normal pressure in the air.

If the Step 2 is completed, the $Cu_2O$ assembly particles are separated from the solution by means of centrifugal separation or the like to obtain a spherical $Cu_2O$ assembly particle composition (Step 3).

Hereinafter, various preferred examples of the present invention will be described in detail for better understandings. However, the examples of the present invention may be modified in various ways, and they should not be interpreted as limiting the scope of the invention. The examples of the present invention are just for better understandings of the invention to persons having ordinary skill in the art.

Embodiment 1

50 mg of $(CH_3COO)_2Cu.H_2O$ and 200 mg of polyacrylamide were dissolved in 4.5 ml of distilled water to prepare a first solution, and 22 mg of ascorbic acid was dissolved in 0.5 ml of distilled water to prepare a second solution. At room temperature and normal pressure and in the air, two solutions were mixed and left fixed for 10 minutes. The mixed solutions were centrifugally separated for 3 minutes at 2000 rpm, and then a supernatant in a upper layer was wasted and the remaining sediment was dispersed again in 20 ml of water. After that, the centrifugal separation was conducted once more to obtain $Cu_2O$ particles.

Figure 3:
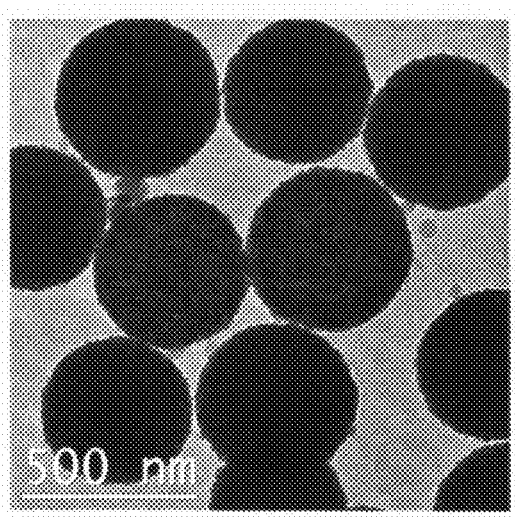
FIG. 3 is a TEM (Transmission Electron Microscope) photograph showing Cu₂O particles prepared according to the first embodiment.
Figure 5:
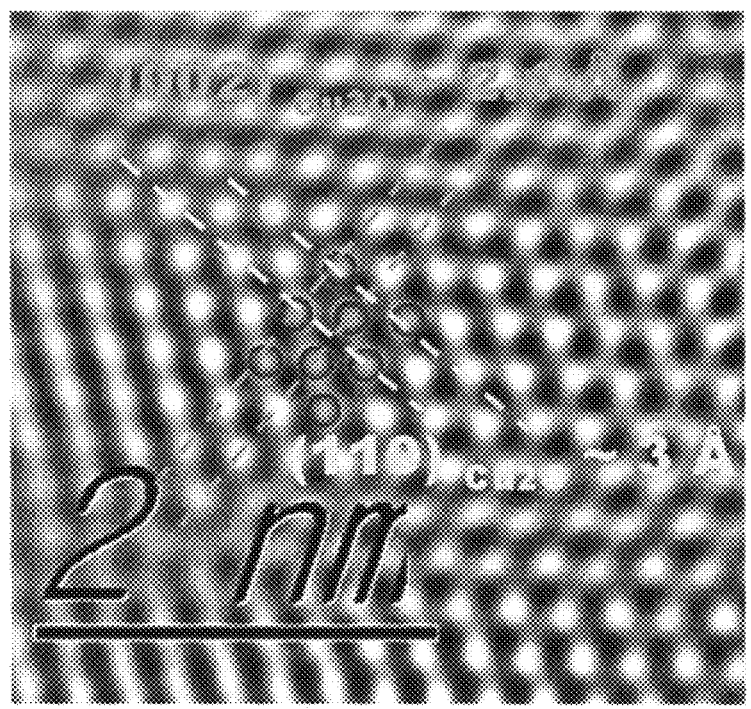
FIG. 5 is a structure analysis photograph showing Cu₂O particles prepared according to the first embodiment, obtained using HRTEM (High Resolution Transmission Electron Microscope).
Figure 6:
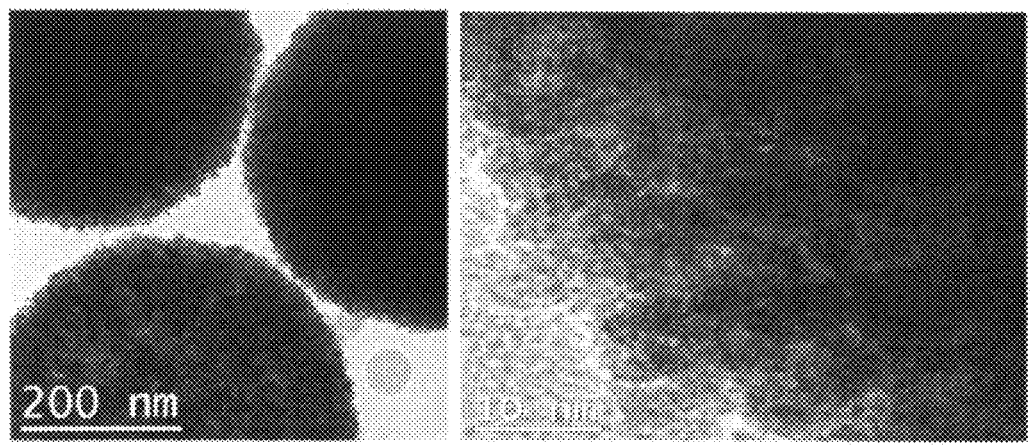
FIG. 6 is a TEM photograph showing an end of the Cu₂O particles prepared according to the first embodiment.
Figure 7:
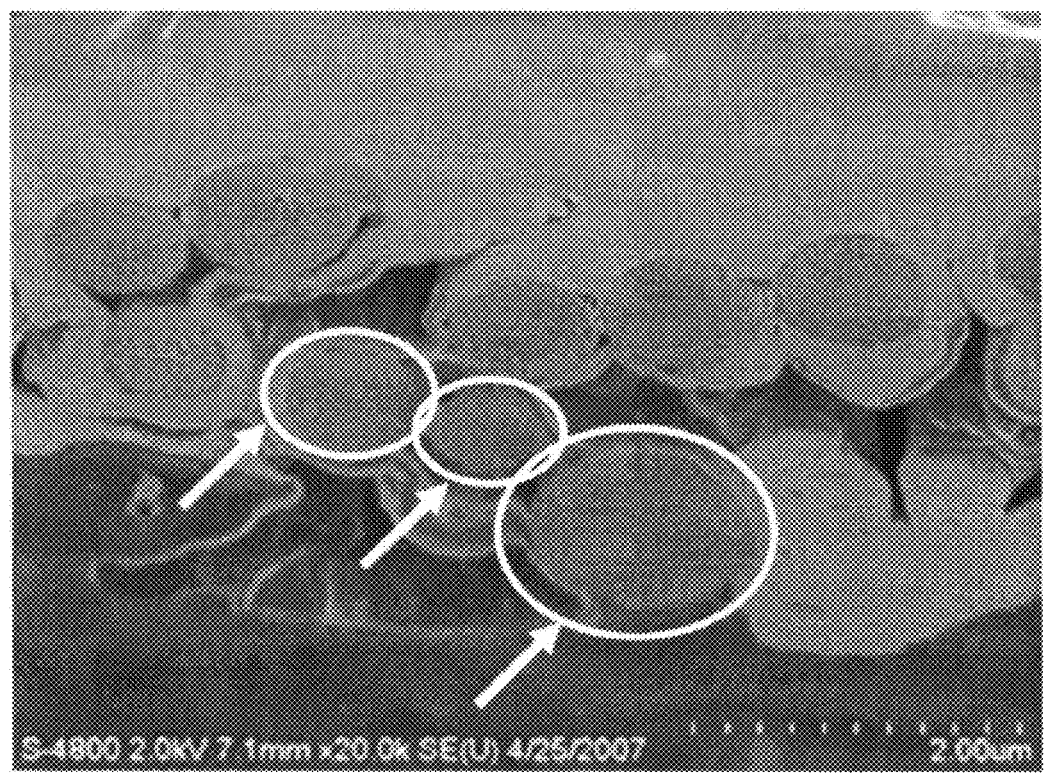
FIG. 7 is a SEM photograph showing Cu₂O particles, obtained by cutting the Cu₂O particles prepared according to the first embodiment using FIB (Focused Ion Beam) and then photographing the same.

The $Cu_2O$ particles are shown in the figures: namely a SEM photograph (see FIG. 2), a TEM photograph (see FIG. 3), an XRD analysis graph (see FIG. 4), a structure analysis photograph of $Cu_2O$ particles using HRTEM (see FIG. 5), a TEM photograph of an end of $Cu_2O$ particles (see FIG. 6), and a SEM photograph of a section of $Cu_2O$ particles cut by FIB (see FIG. 7).

Figure 4:
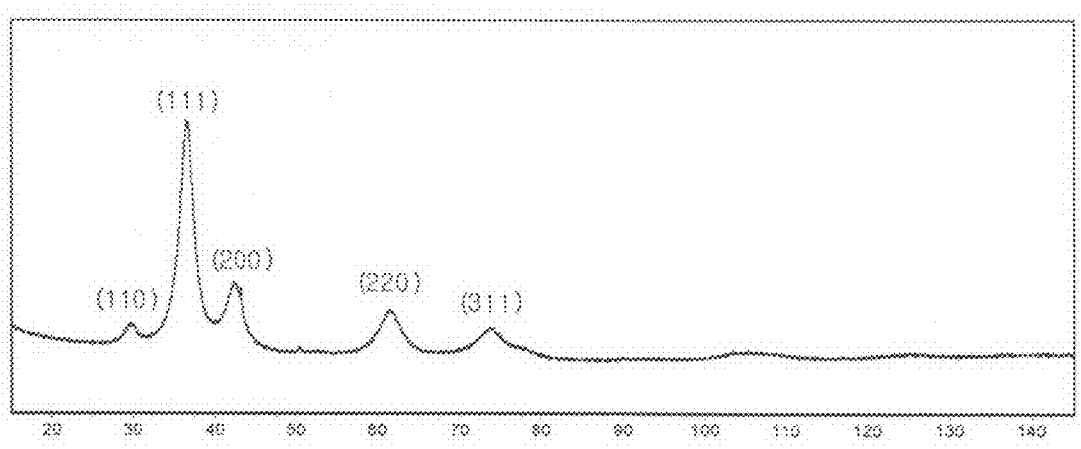
FIG. 4 is a XRD (X-Ray Diffraction) analysis graph showing Cu₂O particles prepared according to the first embodiment.

According to the Scherrer equation for the XRD pattern of FIG. 4, a crystal size was 4.4 nm, which is identical to a particle size of ~5 nm identified by TEM of FIG. 6.

The size of the formed assembly particles was measured for 200 or more particles using a graphic software (MAC-View) based on the SEM image (see FIG. 2), and the obtained statistical distribution was calculated such that an average size is 504.7 nm and a standard deviation is 91.8 (18%).

Embodiment 2

Figure 8:
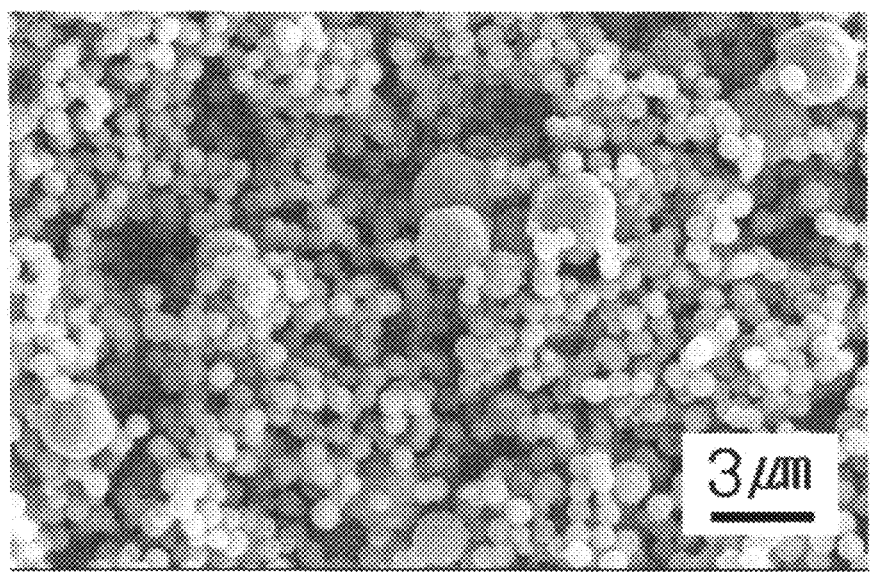
FIG. 8 is a SEM photograph showing Cu₂O particles prepared according to a second embodiment.

$Cu_2O$ particles were made in the same way as in the embodiment 1, except that polyacrylamide was not added. Seeing the SEM photograph of FIG. 8, it would be found that there are some great assembly particles, but spherical $Cu_2O$ assembly particles are formed with relative regular sizes. An average size was calculated as 777.2 nm, and a standard deviation was calculated as 300.6 (39%).

Comparative Example 1

$Cu_2O$ particles were made as explained below according to the method disclosed as a first embodiment in the Korean Laid-open Patent Publication No. 10-2005-84099.

70 ml of distilled water was added to 8 g of copper acetic anhydride. While the mixture was stirred at 25° C., 2.6 ml of 64 weight % hydrazine hydrate was added thereto and reacted such that a mole ratio of hydrazine to copper acetate becomes 1:2, thereby obtaining a $Cu_2O$ particle sediment.

Figure 9:
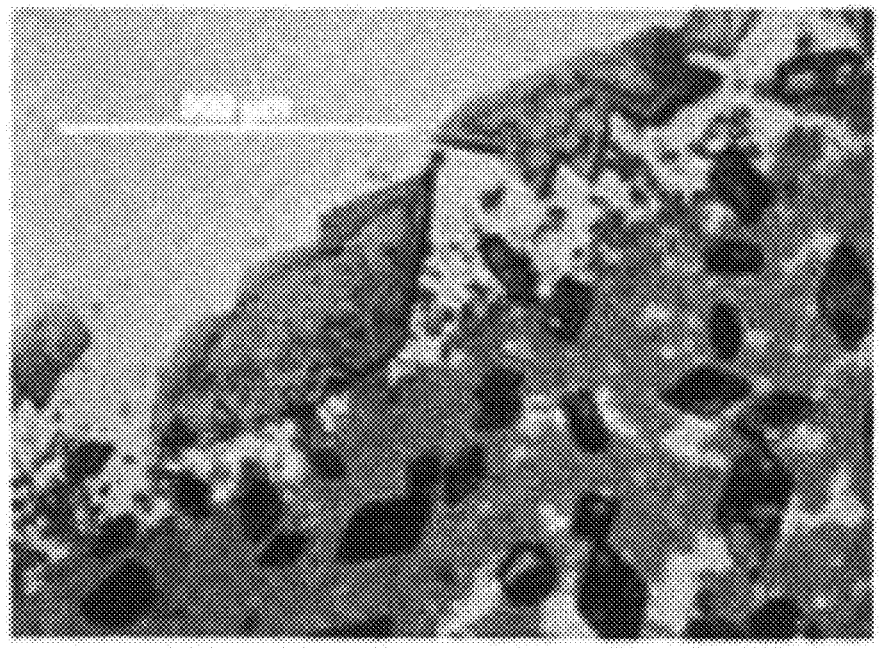
FIG. 9 is an optical microscope photograph showing a sediment made according to a comparative example 1.
Figure 10:
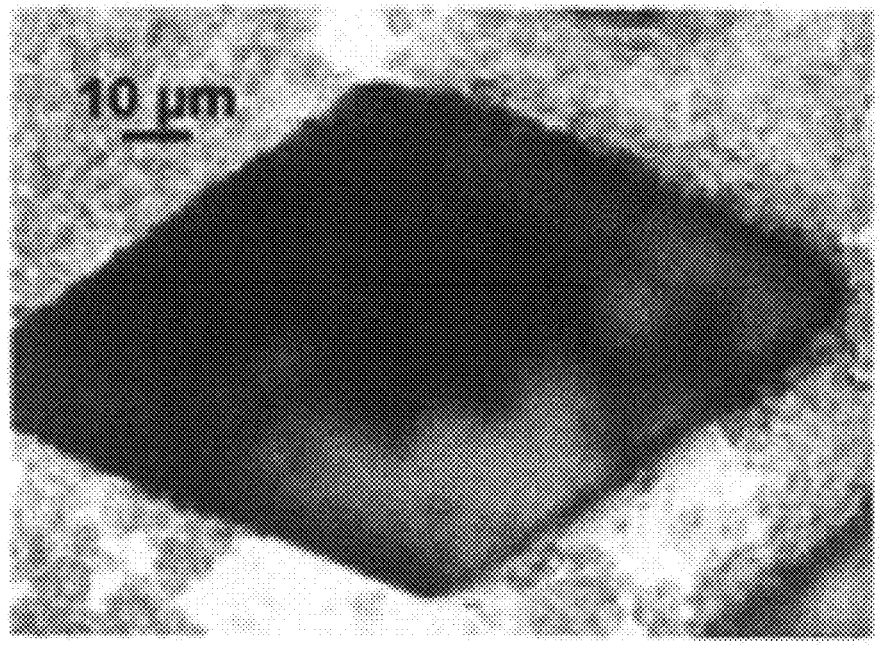
FIG. 10 is a partially-enlarged optical microscope photograph showing the sediment made according to the comparative example 1.

After observing the obtained $Cu_2O$ particle sediment using an optical microscope, there was found a mixture with irregular shapes and sizes (see FIGS. 9 and 10).

INDUSTRIAL APPLICABILITY

The spherical $Cu_2O$ assembly particle composition according to the present invention is composed of $Cu_2O$ assembly particles with excellent uniformity, so it shows excellent properties such as realizing a good electric conductivity during a curing process for wiring. Accordingly, the spherical $Cu_2O$ assembly particle composition according to the present invention may be usefully used as precursors for solar energy conversion, magnetic storage medium, catalyst, gas sensor, and copper wire formation.

According to the preparation method of the spherical $Cu_2O$ assembly particle composition of the present invention, it is possible to exhibit inherent properties of ultrafine particles sufficiently and also to prepare a spherical $Cu_2O$ assembly particle composition whose shape and size are controlled. In addition, it is possible to prepare a spherical $Cu_2O$ assembly particle composition with excellent particle uniformity even at a room temperature.

The invention claimed is:

1. A preparation method for a $Cu_2O$ spherical assembly particle composition, comprising:
   (Step 1) preparing a $Cu_2O$ precursor solution by dissolving a carboxyl copper compound expressed by the following Chemical Formula 1, or a copper salt and a carboxyl group-contained compound expressed by the following Chemical Formula 2 into a solvent;
   Chemical Formula 1

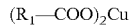
   $(R_1-COO)_2Cu$ where $R_1$ is an alkyl group having a carbon number in the range from 1 to 18,
   Chemical Formula 2

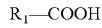
   $R_1-COOH$ where $R_1$ is an alkyl group having a carbon number in the range from 1 to 18,
   (Step 2) putting a weak reducing agent having a standard reduction potential in the range from −0.2 to −0.05V into the $Cu_2O$ precursor solution to form $Cu_2O$ spherical assembly particles, each of which is formed by agglomerating a plurality of $Cu_2O$ ultrafine particles that have an average diameter in the range from 1 to 100 nm and a standard deviation on the diameter in the range from 0 to 10%, the $Cu_2O$ spherical assembly particles having an average diameter in the range from 0.1 to 10 μm and a standard deviation on the diameter in the range from 0 to 40%; and
   (Step 3) separating the $Cu_2O$ spherical assembly particles from the resultant material of the Step 2.

2. The preparation method for a $Cu_2O$ spherical assembly particle composition according to claim 1,
   wherein the carboxyl copper compound is $(CH_3COO)_2Cu$, and the carboxyl group-contained compound is $CH_3COOH$.

3. The preparation method for a $Cu_2O$ spherical assembly particle composition according to claim 1,
   wherein the copper salt is any one material or a mixture of at least two materials selected from the group consisting of copper nitrate, copper halide, copper hydroxide and copper sulfate.

4. The preparation method for a $Cu_2O$ spherical assembly particle composition according to claim 1,
   wherein the solvent is any one material or a mixture of at least two materials selected from the group consisting of water, $C_1$-$C_6$ alcohol, dimethyl formamide, dimethyl sulfoxide, tetrahydrofuran and acetonitrile.

5. The preparation method for a $Cu_2O$ spherical assembly particle composition according to claim 4,
   wherein the solvent contains water.

6. The preparation method for a $Cu_2O$ spherical assembly particle composition according to claim 1,
   wherein the weak reducing agent is any one material or a mixture of at least two materials selected from the group consisting of ascorbic acid, diol compound, citric acid, fructose, amine compound, α-hydroxy ketone compound, succinic acid, and maltose.

7. The preparation method for a $Cu_2O$ spherical assembly particle composition according to claim 6,
   wherein the weak reducing agent is ascorbic acid.

8. The preparation method for a $Cu_2O$ spherical assembly particle composition according to claim 1,
   further comprises adding a surfactant to the $Cu_2O$ precursor solution.

9. The preparation method for a $Cu_2O$ spherical assembly particle composition according to claim 8,
   wherein the surfactant is any one material or a mixture of at least two materials selected from the group consisting of a small molecule having at least one functional group selected from the group consisting of —OH, —COOH, —SH and —NH; polyacrylamide; polyvinylpyrrolidone; and polyvinylalcohol.

10. The preparation method for a $Cu_2O$ spherical assembly particle composition according to claim 9,
    wherein the surfactant is polyacrylamide, and a standard deviation on the diameter of the $Cu_2O$ spherical assembly particles is 0 to 20%.

11. The preparation method for a $Cu_2O$ spherical assembly particle composition according to claim 1,
    wherein the Step 2 is conducted at a temperature in the range from 5 to 40° C.

* * * * *